(12) United States Patent
Morein

(10) Patent No.: US 10,727,214 B2
(45) Date of Patent: Jul. 28, 2020

(54) INTEGRATED CIRCUIT (IC) DEVICE WITH MULTI-DIE INTEGRATION

(71) Applicant: Synaptics Incorporated, San Jose, CA (US)

(72) Inventor: Stephen L. Morein, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/119,137

(22) Filed: Aug. 31, 2018

(65) Prior Publication Data
US 2020/0075566 A1 Mar. 5, 2020

(51) Int. Cl.
| | | |
|---|---|---|
| H01L 21/78 | (2006.01) | |
| H01L 25/18 | (2006.01) | |
| H01L 25/00 | (2006.01) | |
| H01L 25/065 | (2006.01) | |
| H01L 21/683 | (2006.01) | |
| H01L 23/538 | (2006.01) | |
| H01L 23/48 | (2006.01) | |
| H01L 23/00 | (2006.01) | |

(52) U.S. Cl.
CPC .......... *H01L 25/18* (2013.01); *H01L 21/6835* (2013.01); *H01L 21/78* (2013.01); *H01L 23/481* (2013.01); *H01L 23/5386* (2013.01); *H01L 24/97* (2013.01); *H01L 25/0655* (2013.01); *H01L 25/0657* (2013.01); *H01L 25/50* (2013.01); *H01L 2221/6834* (2013.01); *H01L 2221/68327* (2013.01); *H01L 2224/95001* (2013.01)

(58) Field of Classification Search
CPC ..... H01L 25/18; H01L 25/0657; H01L 25/50; H01L 21/6835; H01L 21/78; H01L 21/481; H01L 21/5386; H01L 24/97
See application file for complete search history.

(56) References Cited

U.S. PATENT DOCUMENTS

| | | | | |
|---|---|---|---|---|
| 6,815,712 B1* | 11/2004 | Kline | ...................... | H01L 22/20 257/48 |
| 10,380,284 B2* | 8/2019 | Chen | ...................... | H01L 25/50 |
| 2004/0164226 A1* | 8/2004 | McCaffrey | ............. | H04N 9/045 250/208.1 |
| 2013/0330880 A1* | 12/2013 | Dang | ...................... | H01L 24/97 438/113 |

* cited by examiner

*Primary Examiner* — Hoa B Trinh
(74) *Attorney, Agent, or Firm* — Paradice & Li LLP

(57) ABSTRACT

A method for manufacturing an integrated circuit (IC) device. A first IC wafer is diced to obtain a first superdie including a plurality of first die. A second IC wafer is diced to obtain a second superdie including a plurality of second die. The first superdie and the second superdie are placed on an interposer substrate to form at least part of a composite IC wafer, wherein each of the first die is aligned with a respective one of the second die in the composite IC wafer. The composite IC wafer is diced to obtain a plurality of IC devices, where each of the IC devices includes a respective one of the first die and the second die with which it is aligned.

20 Claims, 11 Drawing Sheets

INTEGRATED CIRCUIT (IC) DEVICE WITH MULTI-DIE INTEGRATION

TECHNICAL FIELD

The present embodiments relate generally to integrated circuit (IC) devices, and specifically to IC devices formed from multiple IC die.

BACKGROUND OF RELATED ART

Semiconductor devices can be broadly categorized into two types: digital and analog. Analog devices may directly measure and/or manipulate the precise electrical properties (e.g., voltages) of real-world signals. For example, a touch sensor may detect objects in contact with and/or proximate to an input surface based on changes in a sensing signal (or electric field) measured at the input surface. The sensor may measure the exact amplitude of the sensing signal to determine the proximity of the object to the input surface. In contrast, digital devices tend to be more concerned with the presence or absence of a signal, rather than the precise amplitude of the signal. For example, a display driver may process image data to determine which pixels of a corresponding display panel should be turned "on" and which pixels should be turned "off."

The manufacture of integrated circuit (IC) devices involves a wafer fabrication process in which circuit components (e.g., resistors, diodes, transistors, etc.) and their interconnections are formed on a single wafer of silicon (or other semiconductor substrate). The size and number of circuit components that can be fabricated on a single wafer of silicon is determined by the process node used during the fabrication process. For example, a smaller process node may produce smaller circuit components that are faster and more power-efficient. Because analog devices have greater precision and sensitivity requirements, their circuit components tend to be larger and consume more power than similar circuitry used in digital devices. Thus, the process node used to manufacture the wafer may be optimized for the type of device. For example, larger process nodes may be used to manufacture analog devices whereas smaller process nodes may be used to manufacture digital devices.

Some IC devices involve a mix of both analog and digital circuitry (e.g., "mixed-signal" devices). For example, an integrated controller that performs the functions of a touch sensor and a display driver may require analog circuitry for sensing and digital circuitry for display. However, as described above, each of the circuit components on a silicon wafer is fabricated using the same process node. Thus, when manufacturing mixed-signal devices, the analog circuitry is fabricated using a process node that is smaller than necessary (e.g., incurring significantly higher manufacturing costs) or the digital circuitry is fabricated using a process node that is larger than necessary (e.g., producing larger and less-efficient circuitry). It is therefore desirable to develop a mixed-signal device that can be manufactured with circuitry optimized for digital and analog applications without incurring unnecessarily high manufacturing costs.

SUMMARY

This Summary is provided to introduce in a simplified form a selection of concepts that are further described below in the Detailed Description. This Summary is not intended to identify key features or essential features of the claims subject matter, nor is it intended to limit the scope of the claimed subject matter.

A method for manufacturing an integrated circuit (IC) device. A first IC wafer is diced to obtain a first superdie including a plurality of uncut first die. A second IC wafer is diced to obtain a second superdie including a plurality of uncut second die. The first superdie and the second superdie are placed on an interposer substrate to form at least part of a composite IC wafer, wherein each of the first die is aligned with a respective one of the second die in the composite IC wafer. The composite IC wafer is diced to obtain a plurality of IC devices, where each of the IC devices includes a respective one of the first die and the second die with which it is aligned.

In some implementations, the first superdie may be fabricated on the first IC wafer using a first process node and the second superdie may be fabricated on the second IC wafer using a second process node that is different than the first process node. For example, in some aspects, the first process node may correspond to a low-power (LP) or embedded-flash (EF) process. In some other aspects, the second process node may correspond to a high-voltage (HV) process.

In some aspects, the first superdie may be placed next to the second superdie in a coplanar configuration. In some other aspects, the first superdie may be placed on at least a portion of the second superdie in a stacked configuration. In some implementations, the first superdie may be connected with the second superdie on the interposer substrate such that each of the first die is electrically coupled to the second die with which it is aligned.

In some aspects, a first IC device of the plurality of IC devices may be placed on a first substrate. For example, the first substrate may comprise a glass or plastic substrate. In some implementations, the first die may be electrically coupled to the second die, in the first IC device, via conductors residing on the first substrate. Thus, in some aspects, the first die may be electrically isolated form the second die, in the first IC device, prior to the placement of the first device on the first substrate.

In some implementations, the first superdie and the second superdie may be placed face-down on a temporary substrate such that circuitry disposed on a top surface of each of the first and second superdie is facing the temporary substrate. Layers of semiconductor substrate are then removed from a bottom surface of at least one of the first superdie or the second superdie while the first and second superdie are placed on the temporary substrate. When a threshold amount of the semiconductor substrate has been removed, the interposer substrate may be bonded to the bottom surface of the first and second superdie. The temporary substrate is then released from the first and second superdie when the first and second superdie are bonded to the interposer substrate.

In some aspects, layers of the semiconductor substrate may be removed until the bottom surface of the first superdie is coplanar with the bottom surface of the second superdie. Accordingly, the top surface of the first superdie may be coplanar with the top surface of the second superdie when the first and second superdie are bonded to the interposer substrate.

BRIEF DESCRIPTION OF THE DRAWINGS

The present embodiments are illustrated by way of example and are not intended to be limited by the figures of the accompanying drawings.

DETAILED DESCRIPTION

Figure 1:
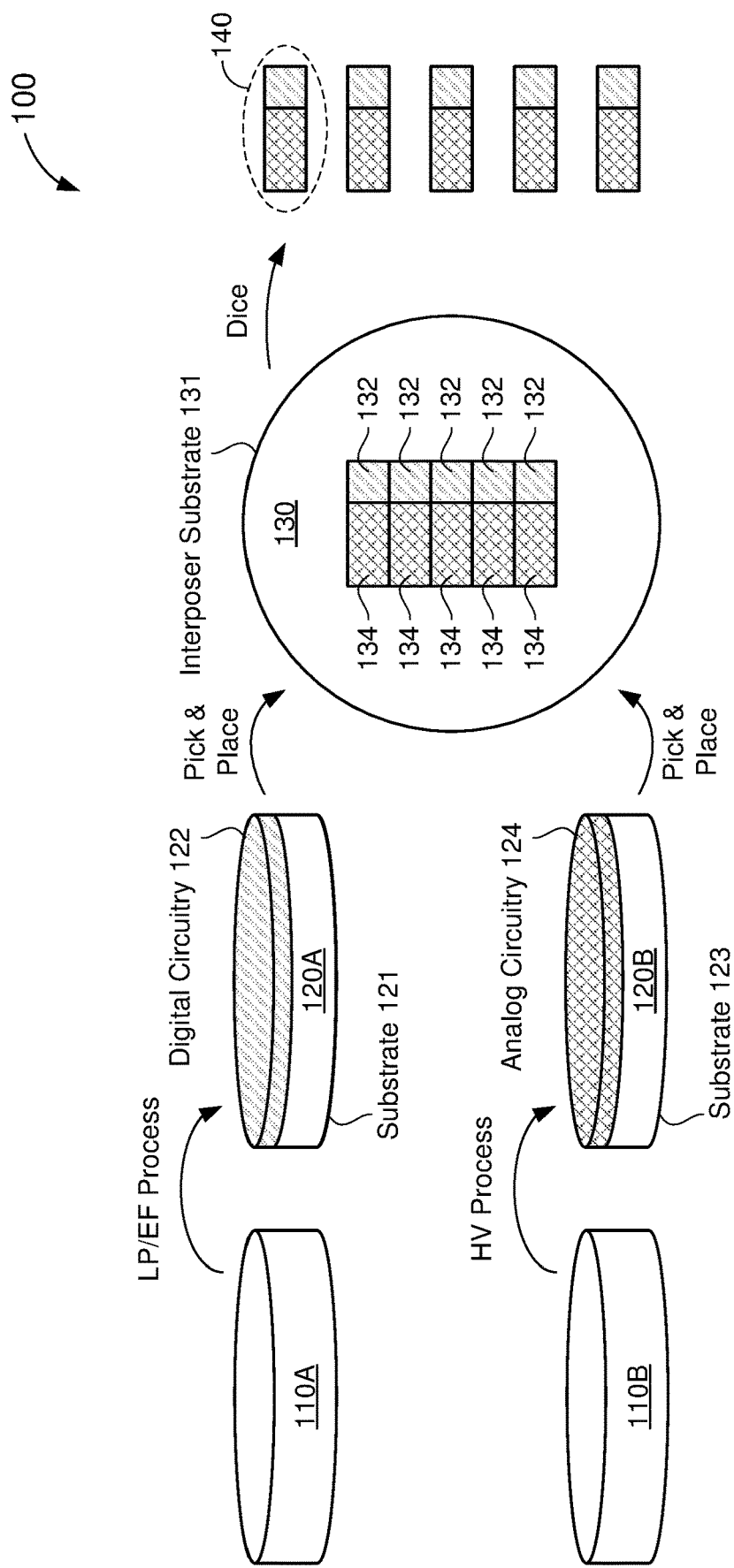
FIG. 1 shows an example process of manufacturing a mixed-signal integrated circuit (IC) device, in accordance with some embodiments.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general purpose processor, conventional processor, controller, microcontroller, and/or state machine capable of executing scripts or instructions of one or more software programs stored in memory. The term "voltage source," as used herein may refer to a direct-current (DC) voltage source, an alternating-current (AC) voltage source, or any other means of creating an electrical potential (such as ground).

FIG. 1 shows an example process 100 of manufacturing a mixed-signal integrated circuit (IC) 140, in accordance with some embodiments. The process begins with two separate semiconductor wafers 110A and 110B. For example, the wafers 110A and 110B may be formed from silicon or any other suitable semiconductor material (e.g., gallium arsenide). In the example of FIG. 1, the mixed-signal IC device 140 is formed from two semiconductor wafers. However, in actual implementations, a mixed-signal IC device may be formed using any number of semiconductor wafers.

Digital circuitry 122 is added to the top surface of the first wafer 110A to produce a resulting "digital" wafer 120A. The digital circuitry 122 may include resistors, transistors, diodes, and/or other circuit components that may be used in digital applications. In some embodiments, all of the digital circuitry for the mixed-signal IC device 140 may be provided on the digital wafer 120A. Thus, in some aspects, the digital wafer 120A may be fabricated using a process node that is optimized for manufacturing digital components. For example, the digital circuitry 122 may have relatively low power requirements (e.g., 1V transistors). Thus, in some embodiments, a relatively small (e.g., 28, 40, or 55 nm), low-power (LP), or embedded-flash (EF) process may be used to produce the digital circuitry 122 on the digital wafer 120A. As shown in FIG. 1, the top surface of the digital wafer 120A includes the digital circuitry 122 whereas the bottom surface of the digital wafer 120A may comprise a semiconductor substrate 121 with no exposed circuitry.

Analog circuitry 124 is added to the top surface of the second wafer 110B to produce a resulting "analog" wafer 120B. The analog circuitry 124 may be used in analog applications. In some embodiments, all of the analog circuitry for the mixed-signal IC device 140 may be provided on the analog wafer 120B. Thus, in some aspects, the analog wafer 120B may be fabricated using a process node that is optimized for manufacturing analog components. For example, the analog circuitry 124 may have relatively high power requirements (e.g., 6V or 32V transistors). Thus, in some embodiments, a relatively large (e.g., 0.8 μm) high-voltage (HV) process may be used to produce the analog circuitry 124 on the analog wafer 120B. As shown in FIG. 1, the top surface of the analog wafer 120B includes the analog circuitry 124 whereas the bottom surface of the analog wafer 120B may comprise a semiconductor substrate 123 with no exposed circuitry.

The digital circuitry 122 is then combined with the analog circuitry 124 to produce a composite IC wafer 130. For example, the digital circuitry 122 may include a plurality of digital die 132, where each digital die 132 includes the digital circuit components for a single mixed-signal IC device 140. Similarly, the analog circuitry 124 may include a plurality of analog die 134, where each analog die 134 includes the analog circuitry components for a single mixed-signal IC device 140. In some embodiments, the digital wafer 120A and analog wafer 120B may each be diced (e.g., cut) into a plurality of smaller segments. More specifically, each segment of the digital wafer 120A may include one or more digital die 132 and each segment of the analog wafer 120B may include one or more analog die 134. The digital die 132 and analog die 134 may be combined on an interposer substrate 131 to form the composite IC wafer 130.

In some embodiments, each digital die 132 may be aligned with a respective analog die 134 in the configuration for which they will form a corresponding IC device 140. For example, each digital die 132 may be placed, on the interposer substrate 131, adjacent an analog die 134 such that the digital circuitry 122 residing on the digital die 132 can be electrically coupled to the analog circuitry 124 residing on the analog die 134. The interposer substrate 131 provides structural support for the plurality of digital die 132 and analog die 134. However, in some embodiments, the interposer substrate 131 may also provide at least some of the connections between the digital die 132 and the analog die 134. After aligning the plurality of digital die 132 with the plurality of analog die 134 on the interposer substrate 131, the composite IC wafer 130 may be diced into individual IC devices 140. Thus, each mixed-signal IC device 140 includes a respective digital die 132 (e.g., cut from the digital wafer 120A) and a respective analog die 134 (e.g., cut from the analog wafer 120B).

The mixed-signal IC device 140 offers several advantages over conventional (e.g., monolithic) mixed-signal devices. As described above, the process node used to manufacture a monolithic wafer may be deterministic of the size and/or number of circuit components on the wafer. As a result of fabricating both analog and digital circuitry using the same process node, the analog circuitry may be fabricated using a process node that is smaller than necessary (e.g., incurring high manufacturing costs) or the digital circuitry may be fabricated using a process node that is larger than necessary (e.g., producing larger and less-efficient circuitry). Aspects of the present disclosure recognize that, by manufacturing the mixed-signal IC device 140 on multiple semiconductor wafers (e.g., wafers 110A and 110B), the digital circuitry 122 and analog circuitry 124 may be fabricated using different process nodes. More specifically, the digital circuitry 122 may be fabricated using a process that is optimized for digital circuit components (e.g., 28/40/55 LP/EF) and the analog circuitry 124 may be fabricated using a process that is optimized for analog circuit components (e.g., 80 HV). This may significantly reduce manufacturing costs while ensuring optimal performance of each mixed-signal IC device 140.

It is noted that, in creating the composite IC wafer 130, diced segments of the digital wafer 120A and the analog wafer 120B may be placed on the interposer substrate 131, for example, using "pick-and-place" techniques. It is also noted that the cost picking and placing die on the may become prohibitively expensive when manufacturing a large number of IC devices 140. For example, by picking and placing individual digital die 132 and individual analog die 134 onto the interposer substrate 131, each resulting IC device 140 will incur the cost of two pick-and-place operations. Aspects of the present disclosure recognize that the cost of manufacturing mixed-signal IC devices may be reduced by reducing the number of pick-and-place operations used in creating the composite IC wafer 130.

Figure 2:
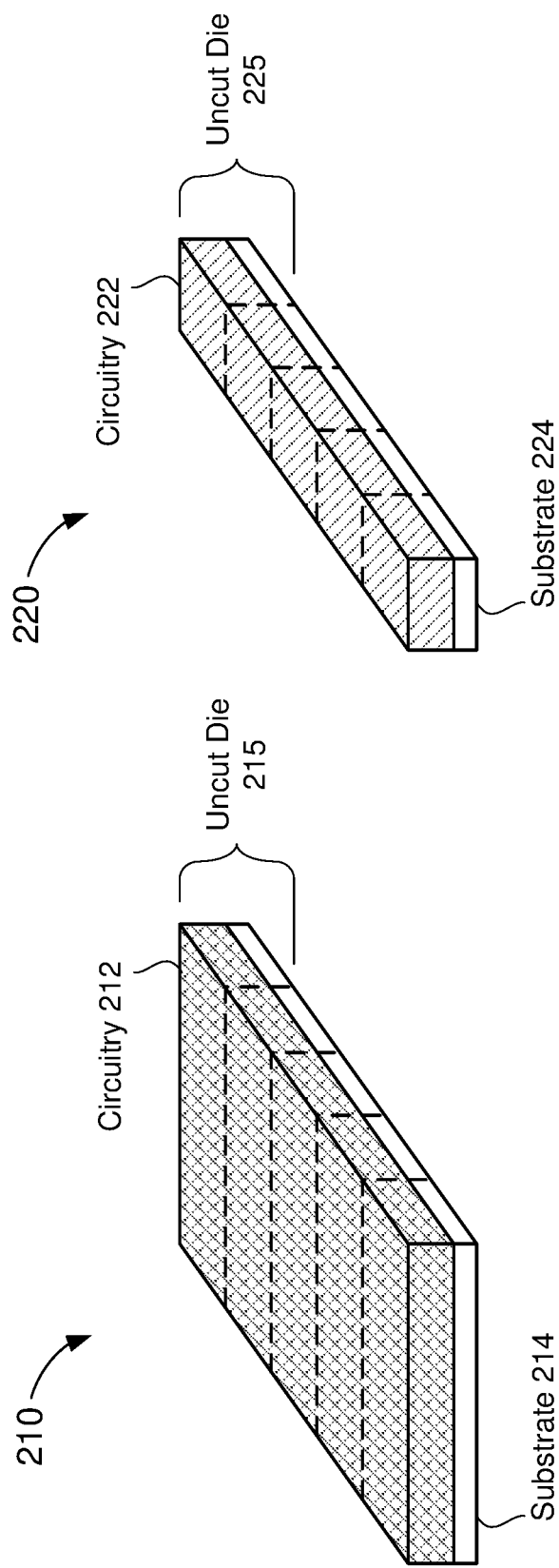
FIG. 2 shows three-dimensional cross-sections of example superdie that can be combined to form a plurality of multi-die IC devices.

In some embodiments, an IC wafer may be diced into one or more "superdie" which are then placed on the interposer substrate 131 to form the composite IC wafer 130. As used herein, the term "superdie" refers to a segment or portion of an IC wafer that includes a plurality of uncut die. FIG. 2 shows an example analog superdie 210 that may be obtained by dicing the analog wafer 120B and an example digital superdie 220 that may be obtained by dicing the digital wafer 120A. The analog superdie 210 includes analog circuitry 212 disposed on a layer of semiconductor substrate 214. For example, the analog circuitry 212 and substrate 214 may correspond to the analog circuitry 124 and substrate 123, respectively, of the analog wafer 120B. The digital superdie 220 includes digital circuitry 222 disposed on a layer of semiconductor substrate 224. For example, the digital circuitry 222 and substrate 224 may correspond to the digital circuitry 122 and substrate 121, respectively, of the digital wafer 120A.

Each of the superdie 210 and 220 may include a plurality of uncut (or unseparated) die. For example, the analog superdie 210 may include a plurality of uncut analog die 215 (e.g., demarcated by the dotted lines). Each uncut analog die 215 may correspond to a respective analog die 134 of FIG. 1. Because each of the uncut die 215 has yet to be diced or separated from the superdie 210, each uncut die 215 may be attached to at least one other uncut die 215 of the analog superdie 210. In the example of FIG. 2, the analog superdie 210 is shown to include five uncut analog die 215. However, in actual implementations, the analog superdie 210 may include fewer or more uncut die 215 than those depicted in FIG. 2. Similarly, the digital superdie 220 may include a plurality of uncut digital die 225 (e.g., demarcated by the dotted lines). Each uncut digital die 225 may correspond to a respective digital die 132 of FIG. 1 and may be attached to at least one other uncut die 225 of the digital wafer 220. In the example of FIG. 2, the digital superdie 220 is shown to include five uncut digital die 225. However, in actual implementations, the digital superdie 220 may include fewer or more uncut die 225 than those depicted in FIG. 2.

In some embodiments, the analog superdie 210 and the digital superdie 220 may be positioned on an interposer substrate (e.g., interposer substrate 131 of FIG. 1) such that each uncut analog die 215 is aligned (or paired) with a corresponding uncut digital die 225. Thus, in some aspects, the number of uncut die 215 of the analog superdie 210 may be equal to the number of uncut die 225 of the digital superdie 220. As described above with respect to FIG. 1, the analog superdie 210 may be aligned with the digital superdie 220 such that the analog circuitry 212 of each uncut analog die 215 may be electrically coupled to the digital circuitry 222 of a corresponding uncut digital die 225. Once the analog superdie 210 and the digital superdie 220 are aligned and bonded to the interposer substrate, the analog superdie 210 and digital superdie 220 may be diced (together with the interposer substrate) into individual IC devices (e.g., as shown in FIG. 1). More specifically, the analog superdie 210 and the digital superdie 220 may be diced (e.g., along the dotted lines) so that each resulting IC device includes a respective analog die (e.g., from an uncut die 215) and a respective digital die (e.g., from an uncut die 225).

In the example of FIG. 2, five mixed-signal IC devices may be obtained by dicing the analog superdie 210 and digital superdie 220 on the interposer substrate (not shown for simplicity). Notably, the five mixed-signal IC devices may be obtained from only two pick-and-place operations (e.g., one for each of the superdie 210 and 220). Thus, by increasing the size (e.g., number of uncut die) of each superdie, the cost of the pick-and-place operations may be amortized over a greater number of mixed-signal IC devices.

Figure 3A:
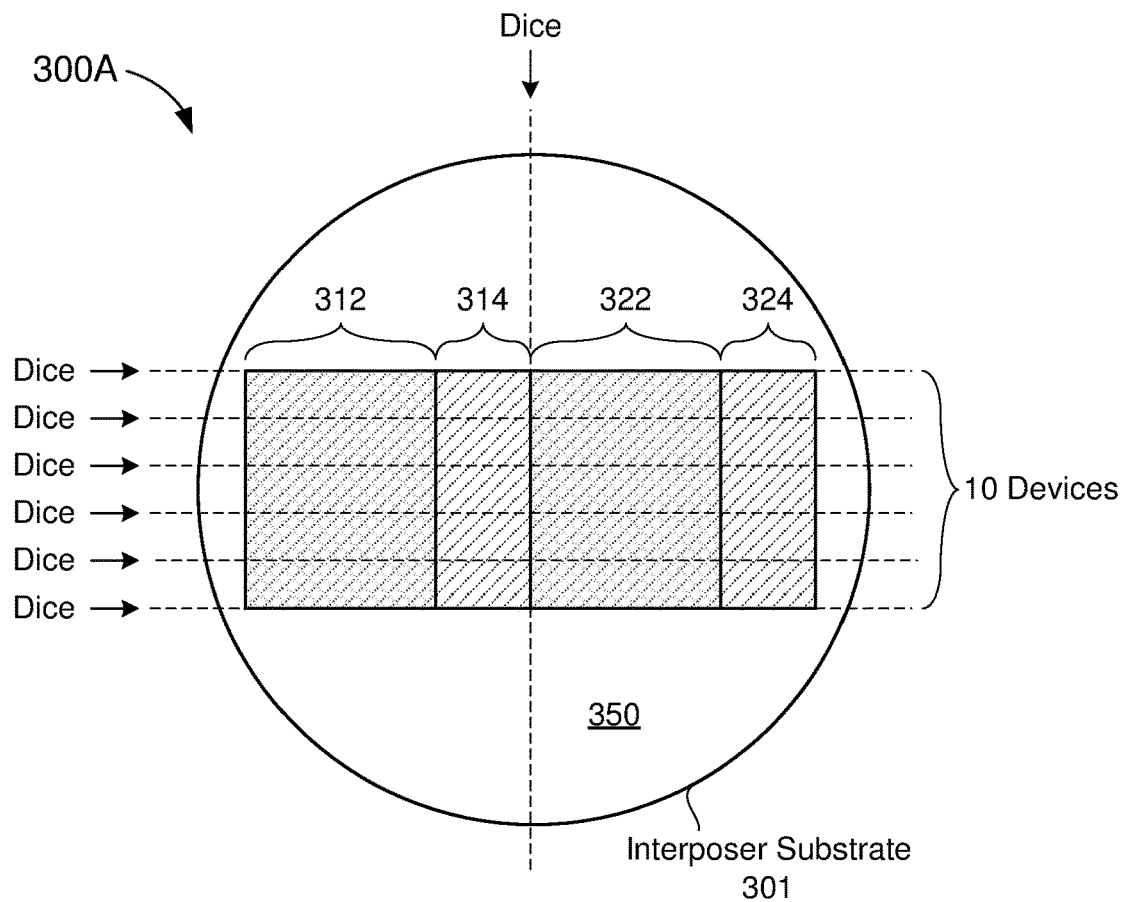
FIGS. 3A and 3B show an example composite IC wafer formed from a plurality of superdie aligned in a coplanar configuration, in accordance with some embodiments.
Figure 3B:
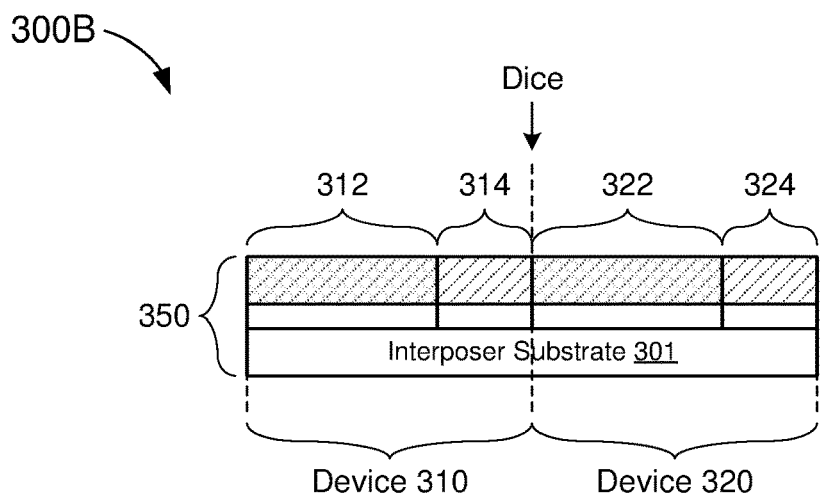

FIGS. 3A and 3B show an example composite IC wafer 350 formed from a plurality of superdie aligned in a coplanar configuration, in accordance with some embodiments. More specifically, FIG. 3A shows a planar view 300A of the composite IC wafer 350 and FIG. 3B shows a cross-sectional view 300B of the composite IC wafer 350. The composite IC wafer 350 may be an example embodiment of the composite IC wafer 130 of FIG. 1.

The composite IC wafer 350 includes a plurality of first superdie 312 and 322 and a plurality of second superdie 314 and 324 disposed on an interposer substrate 301. Each of the first superdie 312 and 322 may include a plurality of uncut first die (demarcated by the dotted lines) and each of the second superdie 314 and 324 may include a plurality of uncut second die (also demarcated by the dotted lines). In some implementations, each of the first superdie 312 and 322 may be an example embodiment of the analog superdie 210 of FIG. 2 and each of the second superdie 314 and 324 may be an example embodiment of the digital superdie 220. Thus, each of the first superdie 312 and 322 may include a plurality of uncut analog die (e.g., uncut die 215) and each of the second superdie 314 and 324 may include a plurality of uncut digital die (e.g., uncut die 225). In the example of FIGS. 3A and 3B, the composite IC wafer 350 is shown to include only four superdie 312, 314, 322, and 324, each comprising five uncut die. However, in actual implementations, the composite IC wafer 350 may include fewer or more superdie, and each superdie may include fewer or more uncut die, than those depicted in FIGS. 3A and 3B.

In the example of FIGS. 3A and 3B, the first superdie 312 is placed next to the second superdie 314, in a coplanar configuration, such that each uncut first die of the first superdie 312 is aligned with a respective uncut second die of the second superdie 314. In some embodiments, the first superdie 312 may be connected to the second superdie 314 such that each uncut first die is electrically coupled to the uncut second die with which it is aligned. For example, in some aspects, a plurality of conductors (e.g., wires, traces, and the like) may be bonded between the top surfaces of the first superdie 312 and the second superdie 314 to couple the circuitry of the first superdie 312 to the circuitry of the second superdie 314. In some other aspects, one or more conductors may be provided on the interposer substrate 301 to couple the circuitry of the first superdie 312 to the circuitry of the second superdie 314. In some other embodiments, the circuitry of the first superdie 312 may remain electrically isolated from the circuitry of the second superdie 314 until after the composite IC wafer 350 is diced into individual IC devices.

In the example of FIGS. 3A and 3B, the first superdie 322 is also placed next to the second superdie 324, in a coplanar configuration, such that each uncut first die of the first superdie 322 is aligned with a respective uncut second die of the second superdie 324. In some embodiments, the first superdie 322 may be connected to the second superdie 324 such that each uncut first die is electrically coupled to the uncut second die with which it is aligned. In some other embodiments, the circuitry of the first superdie 322 may remain electrically isolated from the circuitry of the second superdie 324 until after the composite IC wafer 350 is diced into individual IC devices.

In some embodiments, the composite IC wafer 350 may be diced (e.g., along the dotted lines) into a plurality of IC devices 310 and 320. More specifically, each of the IC devices 310 may include a first die cut from the first superdie 312 and a second die cut from the second superdie 314. Further, each of the IC devices 320 may include a first die cut from the first superdie 322 and a second die cut from the second superdie 324. For example, each of the IC devices 310 and 320 may be a mixed-signal device formed from the combination of an analog die (e.g., the first die) and a digital die (e.g., the second die). In the example of FIGS. 3A and 3B, ten mixed-signal IC devices may be obtained from the composite IC wafer 350 at the cost of only four pick-and-place operations (e.g., for each of the first superdie 312 and 322 and each of the second superdie 314 and 324).

Figure 4A:
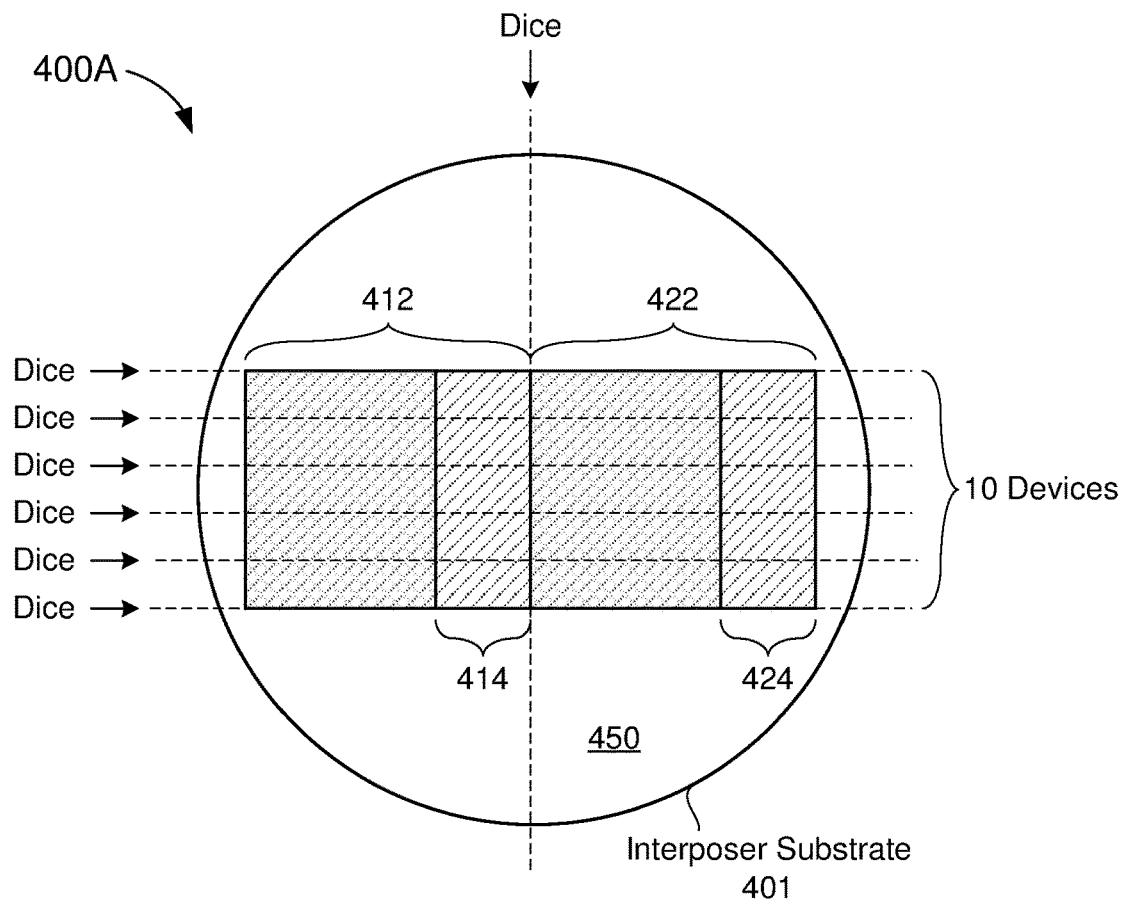
FIGS. 4A and 4B show an example composite IC wafer formed from a plurality of superdie aligned in a stacked configuration, in accordance with some embodiments.
Figure 4B:
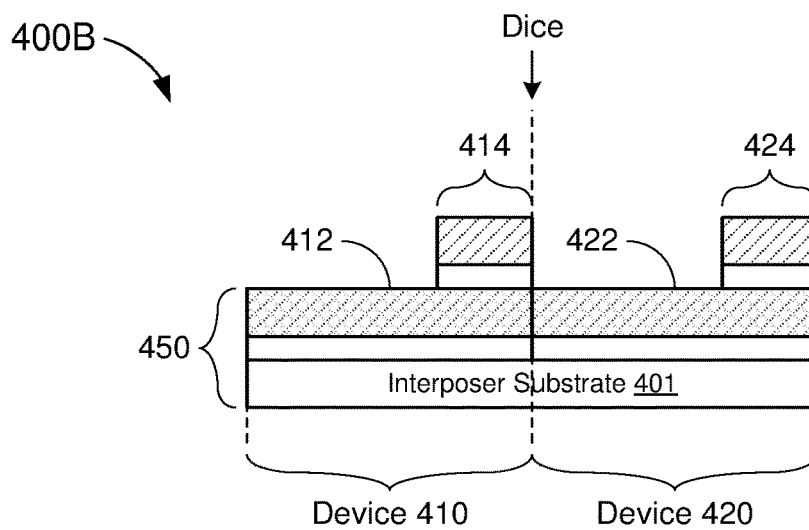

FIGS. 4A and 4B show an example composite IC wafer formed from a plurality of superdie aligned in a stacked configuration, in accordance with some embodiments. More specifically, FIG. 4A shows a planar view 400A of the composite IC wafer 450 and FIG. 4B shows a cross-sectional view 400B of the composite IC wafer 450. The composite IC wafer 450 may be an example embodiment of the composite IC wafer 130 of FIG. 1.

The composite IC wafer 450 includes a plurality of first superdie 412 and 422 and a plurality of second superdie 414 and 424 disposed on an interposer substrate 401. Each of the first superdie 412 and 422 may include a plurality of uncut first die (demarcated by the dotted lines) and each of the second superdie 414 and 424 may include a plurality of uncut second die (also demarcated by the dotted lines). In some implementations, each of the first superdie 412 and 422 may be an example embodiment of the analog superdie 210 of FIG. 2 and each of the second superdie 414 and 424 may be an example embodiment of the digital superdie 220. Thus, each of the first superdie 412 and 422 may include a plurality of uncut analog die (e.g., uncut die 215) and each of the second superdie 414 and 424 may include a plurality of uncut digital die (e.g., uncut die 225). In the example of FIGS. 4A and 4B, the composite IC wafer 450 is shown to include only four superdie 412, 414, 422, and 424, each comprising five uncut die. However, in actual implementations, the composite wafer 450 may include fewer or more superdie, and each superdie may include fewer or more uncut die, than those depicted in FIGS. 4A and 4B.

In the example of FIGS. 4A and 4B, the second superdie 414 is placed on top of the first superdie 412, in a stacked configuration, such that each uncut second die of the second superdie 414 is aligned with a respective uncut first die of the first superdie 412. In some embodiments, the first superdie 412 may be connected to the second superdie 414 such that each uncut first die is electrically coupled to the uncut second die with which it is aligned. For example, in some aspects, a plurality of conductors (e.g., wires, traces, and the like) may be bonded between the top surfaces of the first superdie 412 and the second superdie 414 to couple the circuitry of the first superdie 412 to the circuitry of the second superdie 414. In some other aspects, the second superdie 414 may be vertically connected to the first superdie 412, for example, by using one or more through-silicon vias (TSVs) to electrically couple the circuitry on the top surface the second superdie 414 to the circuitry on the top surface of the first superdie 412.

In the example of FIGS. 4A and 4B, the second superdie 424 is also placed on top of the first superdie 422, in a stacked configuration, such that each uncut second die of the second superdie 424 is aligned with a respective uncut first die of the first superdie 422. In some embodiments, the first superdie 422 may be connected to the second superdie 424 such that each uncut first die is electrically coupled to the uncut second die with which it is aligned. In some aspects, a plurality of conductors may be bonded between the top surfaces of the first superdie 422 and the second superdie 424 to couple the circuitry of the first superdie 422 to the circuitry of the second superdie 424. In some other aspects, the second superdie 424 may be vertically connected to the first superdie 422, for example, by using one or more TSVs to electrically couple the circuitry on the top surface the second superdie 424 to the circuitry on the top surface of the first superdie 422.

In some embodiments, the composite IC wafer 450 may be diced (e.g., along the dotted lines) into a plurality of IC devices 410 and 420. More specifically, each of the IC devices 410 may include a first die cut from the first superdie 412 and a second die cut from the second superdie 414. Further, each of the IC devices 420 may include a first die cut from the first superdie 422 and a second die cut from the second superdie 424. For example, each of the IC devices 410 and 420 may be a mixed-signal device formed from the combination of an analog die (e.g., the first die) and a digital die (e.g., the second die). In the example of FIGS. 4A and 4B, ten mixed-signal IC devices may be obtained from the composite IC wafer 450 at the cost of only four pick-and-place operations (e.g., for each of the first superdie 412 and 422 and each of the second superdie 414 and 424). Moreover, due to the stacked configuration of the first superdie 412 and 422 and the second superdie 414 and 424, the IC devices 410 and 420 may have a smaller footprint than the IC devices 310 and 320 of FIGS. 3A and 3B.

Figure 5A:
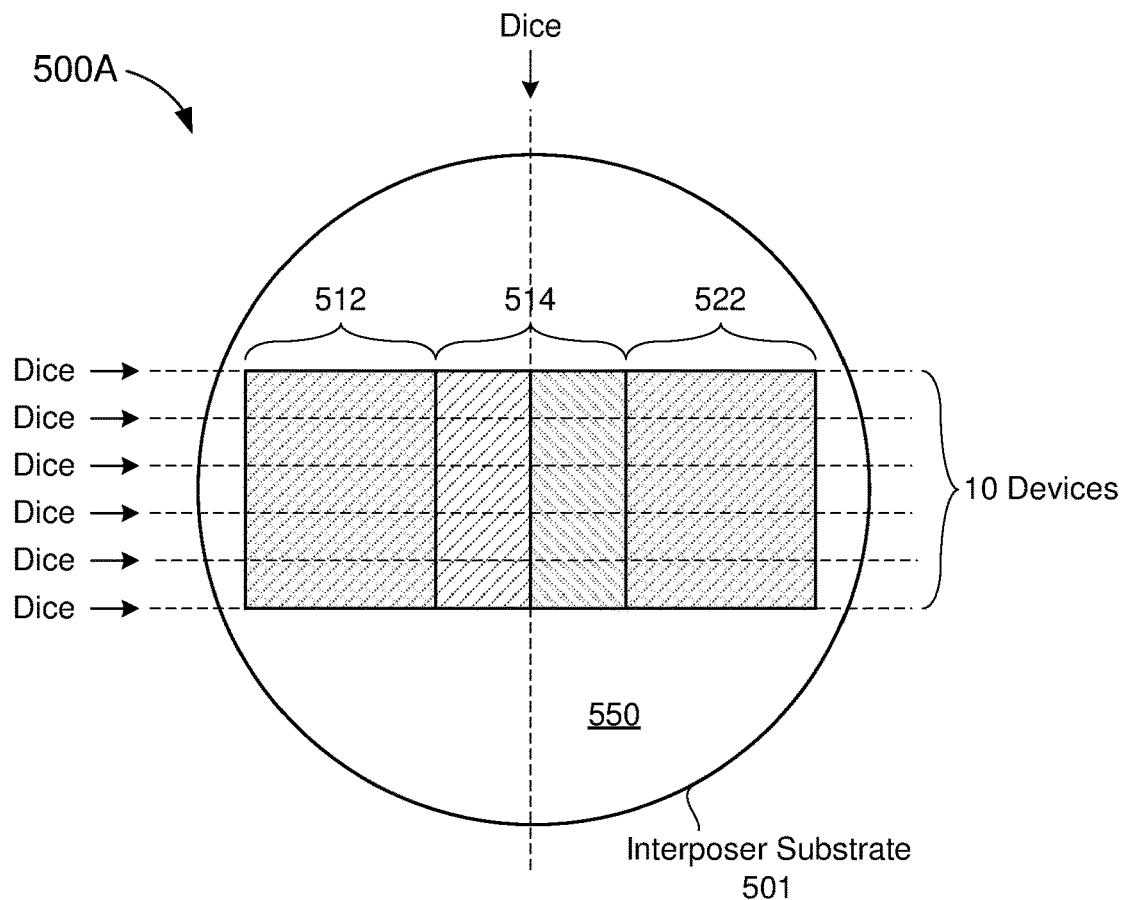
FIGS. 5A and 5B show an example composite IC wafer formed from a plurality of superdie aligned in a coplanar configuration, in accordance with some other embodiments.
Figure 5B:
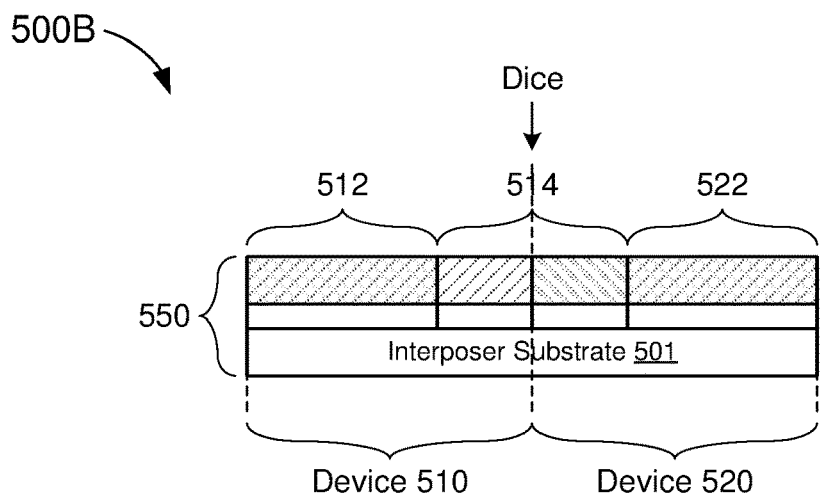

FIGS. 5A and 5B show an example composite IC wafer formed from a plurality of superdie aligned in a coplanar configuration, in accordance with some other embodiments. More specifically, FIG. 5A shows a planar view 500A of the composite IC wafer 550 and FIG. 5B shows a cross-sectional view 500B of the composite IC wafer 550. The composite IC wafer 550 may be an example embodiment of the composite IC wafer 130 of FIG. 1.

The composite IC wafer 550 includes a plurality of first superdie 512 and 522 and a second superdie 514 disposed on an interposer substrate 501. Each of the first superdie 512 and 522 may include a plurality of uncut first die (demarcated by the dotted lines) and the second superdie 514 may include a plurality of uncut second die (also demarcated by the dotted lines). In some implementations, each of the first superdie 512 and 522 may be an example embodiment of the analog superdie 210 of FIG. 2 and the second superdie 514 may be an example embodiment of the digital superdie 220. Thus, each of the first superdie 512 and 522 may include a plurality of uncut analog die (e.g., uncut die 215) and the second superdie 514 may include a plurality of uncut digital die (e.g., uncut die 225).

In some embodiments, the second superdie 514 may include multiple rows and multiple columns of uncut second die. In the example of FIGS. 5A and 5B, the second superdie 514 is shown to include two columns of second die, with each column including five uncut second die. More specifically, the second superdie 514 may be arranged such that each of the uncut second die in one of the columns is opposite in polarity to each of the uncut second die in the other column. In the example of FIGS. 5A and 5B, the composite IC wafer 550 is shown to include only three superdie 512, 514, and 522, where each of the first superdie 512 and 522 includes five uncut first die and the second superdie 514 includes ten uncut second die. However, in actual implementations, the composite IC wafer 550 may include fewer or more superdie, and each superdie may include fewer or more uncut die, than those depicted in FIGS. 5A and 5B.

In the example of FIGS. 5A and 5B, the first superdie 512 is placed next to the second superdie 514, in a coplanar configuration, such that each uncut first die of the first superdie 512 is aligned with a respective uncut second die of the second superdie 514. In some embodiments, the first superdie 512 may be connected to the second superdie 514 such that each uncut first die is electrically coupled to the uncut second die with which it is aligned. For example, in some aspects, a plurality of conductors may be bonded between the top surfaces of the first superdie 512 and the second superdie 514 to couple the circuitry of the first superdie 512 to the circuitry of the second superdie 514. In some other aspects, one or more conductors may be provided on the interposer substrate 501 to couple the circuitry of the first superdie 512 to the circuitry of the second superdie 514. In some other embodiments, the circuitry of the first superdie 512 may remain electrically isolated from the circuitry of the second superdie 514 until after the composite IC wafer 550 is diced into individual IC devices.

In the example of FIGS. 5A and 5B, the first superdie 522 is also placed next to the second superdie 514, in a coplanar configuration, such that each uncut first die of the first superdie 522 is aligned with a respective uncut second die of the second superdie 514. In some embodiments, the first superdie 522 may be connected to the second superdie 514 such that each uncut first die is electrically coupled to the uncut second die with which it is aligned. In some other embodiments, the circuitry of the first superdie 522 may remain electrically isolated from the circuitry of the second superdie 514 until after the composite IC wafer 550 is diced into individual IC devices.

In some embodiments, the composite IC wafer 550 may be diced (e.g., along the dotted lines) into a plurality of IC devices 510 and 520. More specifically, each of the IC devices 510 may include a first die cut from the first superdie 512 and a second die cut from the second superdie 514. Further, each of the IC devices 520 may include a first die cut from the first superdie 522 and a second die cut from the second superdie 514. For example, each of the IC devices 510 and 520 may be a mixed-signal device formed from the combination of an analog die (e.g., the first die) and a digital die (e.g., the second die). In the example of FIGS. 5A and 5B, ten mixed-signal IC devices may be obtained from the composite IC wafer 550 at the cost of only three pick-and-place operations (e.g., for each of the first superdie 512 and 522 and the second superdie 514).

Figure 6A:
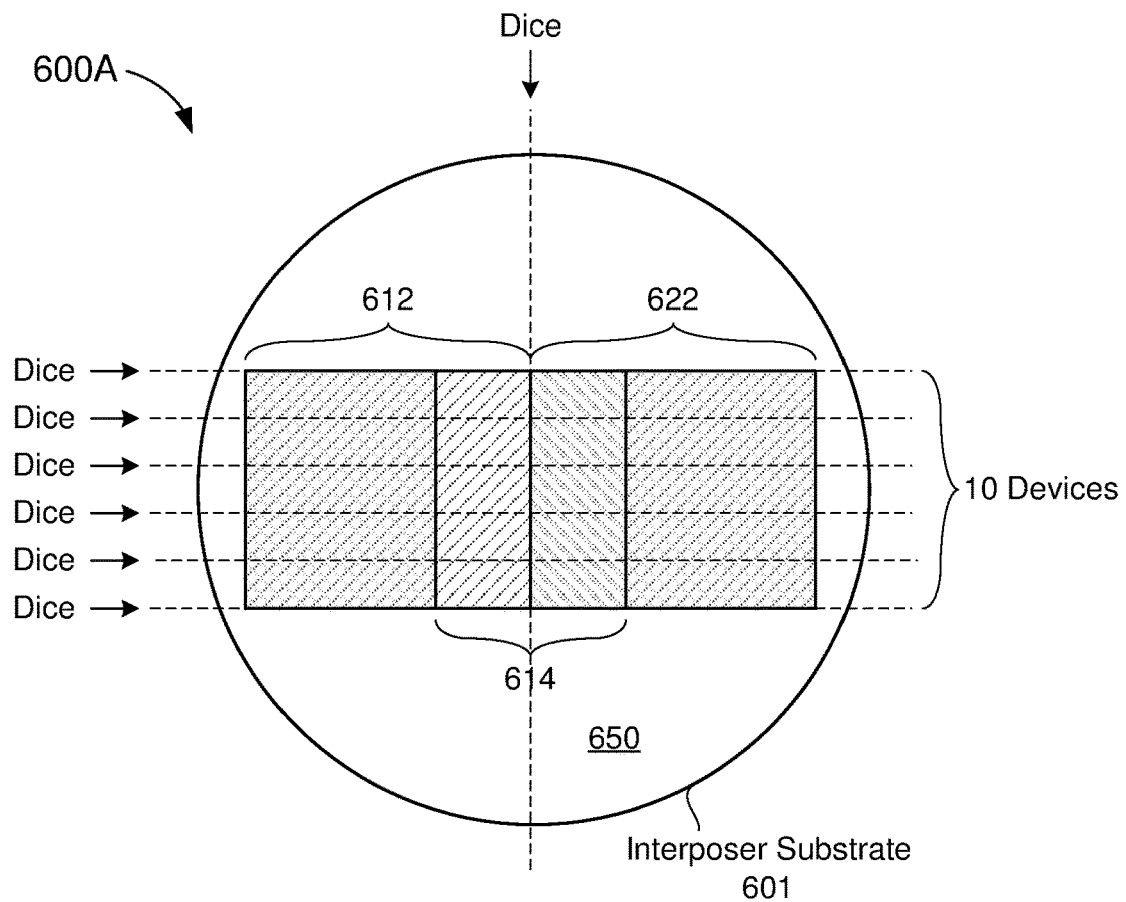
FIGS. 6A and 6B show an example composite IC wafer formed from a plurality of superdie aligned in a stacked configuration, in accordance with some other embodiments.
Figure 6B:
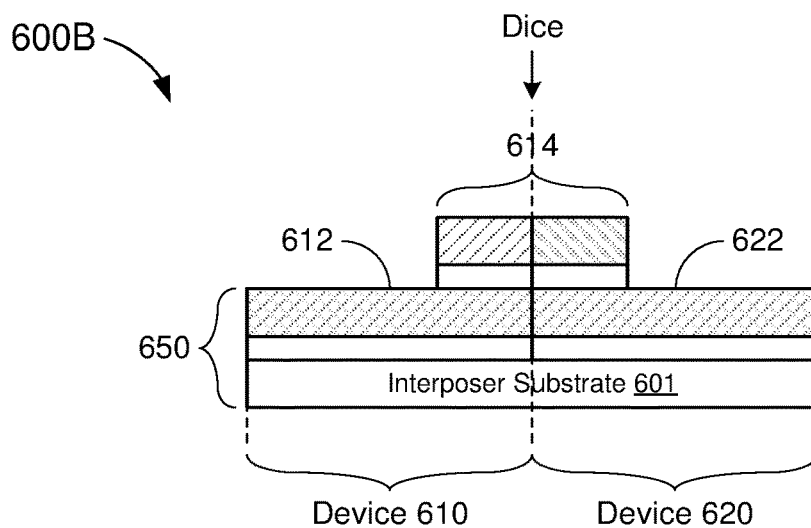

FIGS. 6A and 6B show an example composite IC wafer formed from a plurality of superdie aligned in a stacked configuration, in accordance with some other embodiments. More specifically, FIG. 6A shows a planar view 600A of the composite IC wafer 650 and FIG. 6B shows a cross-sectional view 600B of the composite IC wafer 650. The composite IC wafer 650 may be an example embodiment of the composite IC wafer 130 of FIG. 1.

The composite IC wafer 650 includes a plurality of first superdie 612 and 622 and a second superdie 614 disposed on an interposer substrate 601. Each of the first superdie 612 and 622 may include a plurality of uncut first die (demarcated by the dotted lines) and the second superdie 614 may include a plurality of uncut second die (also demarcated by the dotted lines). In some implementations, each of the first superdie 612 and 622 may be an example embodiment of the analog superdie 210 of FIG. 2 and the second superdie 614 may be an example embodiment of the digital superdie 220. Thus, each of the first superdie 612 and 622 may include a plurality of uncut analog die (e.g., uncut die 215) and the second superdie 614 may include a plurality of uncut digital die (e.g., uncut die 225).

In some embodiments, the second superdie 614 may include multiple rows and multiple columns of uncut second die. In the example of FIGS. 6A and 6B, the second superdie 614 is shown to include two columns of second die, with each column including five uncut second die. More specifically, the second superdie 614 may be arranged such that each of the uncut second die in one of the columns is opposite in polarity to each of the uncut second die in the other column. In the example of FIGS. 6A and 6B, the composite IC wafer 650 is shown to include only three superdie 612, 614, and 622, where each of the first superdie 612 and 622 includes five uncut first die and the second superdie 614 includes ten uncut second die. However, in actual implementations, the composite IC wafer 650 may include fewer or more superdie, and each superdie may include fewer or more uncut die, than those depicted in FIGS. 6A and 6B.

In the example of FIGS. 6A and 6B, the second superdie 614 is placed on top of the first superdie 612 and 622, in a stacked configuration, such that each uncut second die of the second superdie 614 is aligned with a respective uncut first die of the first superdie 612 or 622. In some embodiments, the first superdie 612 and 622 may be connected to the second superdie 614 such that each uncut first die is electrically coupled to the uncut second die with which it is aligned. For example, in some aspects, a plurality of conductors (e.g., wires, traces, and the like) may be bonded between the top surfaces of the first superdie 612 and 622 and the second superdie 614 to couple respective circuitry of the first superdie 612 and 622 to the circuitry of the second superdie 614. In some other aspects, the second superdie 614 may be vertically connected to the first superdie 612 and 622, for example, by using one or more TSVs to electrically couple the circuitry on the top surface the second superdie 614 to the circuitry on the top surfaces of the first superdie 612 and 622.

In some embodiments, the composite IC wafer 650 may be diced (e.g., along the dotted lines) into a plurality of IC devices 610 and 620. More specifically, each of the IC devices 610 may include a first die cut from the first superdie 612 and a second die cut from the second superdie 614. Further, each of the IC devices 620 may include a first die cut from the first superdie 622 and a second die cut from the second superdie 614. For example, each of the IC devices 610 and 620 may be a mixed-signal device formed from the combination of an analog die (e.g., the first die) and a digital die (e.g., the second die). In the example of FIGS. 6A and 6B, ten mixed-signal IC devices may be obtained from the composite IC wafer 650 at the cost of only three pick-and-place operations (e.g., for each of the first superdie 612 and 622 and the second superdie 614). Moreover, due to the stacked configuration of the first superdie 612 and 622 and the second superdie 614, the IC devices 610 and 620 may have a smaller footprint than the IC devices 510 and 520 of FIGS. 5A and 5B.

It is noted that the interposer substrate (e.g., which may be silicon, glass, or any other suitable material) provides structural support for the superdie placed thereon. However, the interposer substrate also adds to the overall thickness of each resulting IC device (e.g., as shown in FIGS. 3B, 4B, 5B, and 6B). Thus, it may be desirable to thin the superdie (e.g., by removing layers of semiconductor material from the bottom surfaces of each superdie) prior to placement on the interposer substrate. Aspects of the present disclosure recognize that thin die (or superdie) tend to be very fragile and thus difficult to pick-and-place on the interposer substrate. Thus, in some embodiments, the pick-and-place operations may be performed prior to thinning the superdie. More specifically, the superdie may be aligned (e.g., on a temporary substrate) while retaining their original thickness and subsequently thinned to a desired thickness.

FIGS. 7A-7D show an example process 700A-700D of creating a composite IC wafer, in accordance with some embodiments. For example, the process may be used to create any of the combined IC wafers described herein. In some embodiments, the process 700 may be used to bond a plurality of superdie to an interposer substrate while avoiding any handling of thin die. In the example of FIGS. 7A-7D, a composite IC wafer is formed from two superdie 712 and 722. However, in actual implementations, the process 700A-700D may be used to create a composite IC wafer having any number of superdie disposed thereon.

Figure 7A:
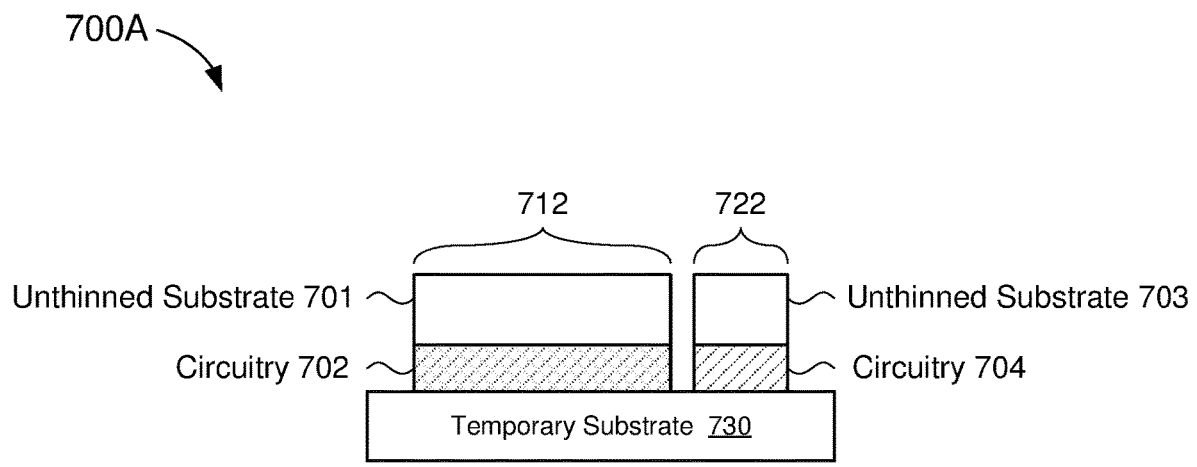
FIGS. 7A-7D show an example process of creating a composite IC wafer, in accordance with some embodiments.

With reference to FIG. 7A, a plurality of superdie 712 and 722 are aligned and placed on a temporary substrate 730 in a first step of the process 700A. The temporary substrate 730 may include any suitable material that provides a temporary surface on which the superdie 712 and 722 can be aligned. In some embodiments, the superdie 712 and 722 may be picked and placed on the temporary substrate 730 in their original ("thick") form. For example, the bottom surfaces of the superdie 712 and 722 may comprise unthinned semiconductor substrates 701 and 703, respectively. In some embodiments, each of the superdie 712 and 722 may be placed face-down on the temporary substrate 730 (so that circuitry 702 and 704 on the top surfaces of the superdie 712 and 722, respectively, faces the temporary substrate 730). In some aspects, the superdie 712 and 722 may be attached or bonded to the temporary substrate 730 using a removable adhesive (e.g., epoxy, hard wax, resin, or glue).

Figure 7B:
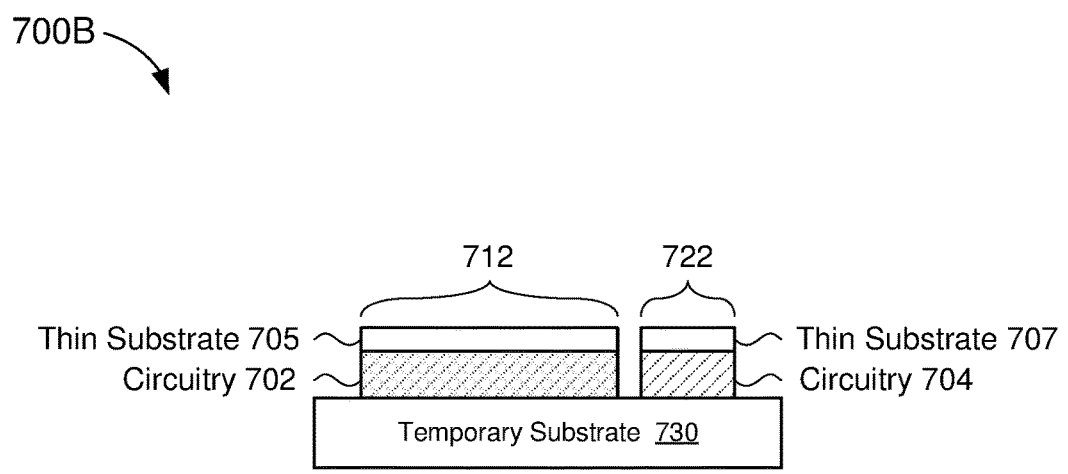

With reference to FIG. 7B, the plurality of superdie 712 and 722 are thinned to a desired thickness in a second step of the process 700B. More specifically, the superdie 712 and 722 may be thinned while remaining face-down on the temporary substrate 730 (e.g., in the configuration depicted in FIG. 7A). For example, the thinning may include removing layers of semiconductor material from the bottom surfaces of one or more of the superdie 712 or 722 (e.g., using backgrinding, chemical mechanical planarization (CMP), or other suitable wafer-thinning techniques). In some embodiments, each of the superdie 712 and 722 may be thinned to a threshold thickness. In some other embodiments, one or more of the superdie 712 or 722 may be thinned until the bottom surfaces of the superdie 712 and 722 are substantially coplanar. As a result of the thinning, the bottom surfaces of the superdie 712 and 722 may comprise thinned semiconductor substrates 705 and 707, respectively.

Figure 7C:
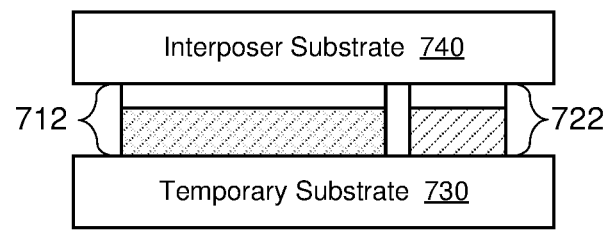

With reference to FIG. 7C, an interposer substrate 740 is bonded to the bottom surfaces of the superdie 712 and 722 in a third step of the process 700C. As described above, the interposer substrate 740 (e.g., which may be silicon, glass, or any other suitable material) provides structural support for the superdie 712 and 722. More specifically, the interposer substrate 740 may permanently hold the superdie 712 and 722 in alignment after the combined wafer is diced into a mixed-signal IC device. It is noted that, because the superdie 712 and 722 are already aligned on the temporary substrate 730, the interposer wafer 740 may be bonded to the superdie 712 and 722 without handling thin die. Moreover, the thinning operation (e.g., in the second step of the process 700B) may ensure that the bottom surfaces of the superdie 712 and 722 provide a substantially flat or level surface on which the interposer substrate 740 can be bonded.

Figure 7D:
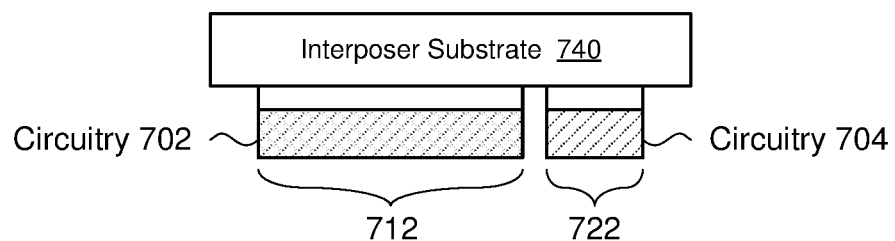

With reference to FIG. 7D, the temporary substrate 730 is released from to the top surfaces of the superdie 712 and 722 in a fourth step of the process 700D. For example, the temporary substrate 730 may be released by heating or melting the adhesive holding the temporary substrate 730 to the top surfaces of the superdie 712 and 722. Upon releasing the temporary substrate 730, the resulting assembly may correspond to a composite IC wafer. It is noted that, because the superdie 712 and 722 were aligned face-down on the temporary substrate 730 (e.g., as shown in FIGS. 7A-7C), the top surfaces of the superdie 712 and 722 may be substantially coplanar. Thus, in some embodiments, the circuitry 702 of superdie 712 may be electrically coupled to the circuitry of superdie 722 using existing wire bonding techniques.

As described above, mixed-signal IC devices are often implemented in touch-screen devices, for example, to control the sensing functions of a touch sensor (e.g., using analog circuitry) as well as the display functions of a display driver (e.g., using digital circuitry). Thus, in some implementations, the mixed-signal IC device may be coupled to a display panel (e.g., glass, plastic, or other substrate) to form a chip-on-substrate (COS) assembly. It is noted that the display panel is often manufactured with circuitry (e.g., sensor electrodes, display electrodes, and the like) for performing various functions of the touch-screen device. Aspects of the present disclosure recognize that the manufacturing costs of the mixed-signal IC devices may be further reduced by leveraging circuitry on the display panel to couple the analog die with the digital die. Thus, in some embodiments, the individual die (e.g., the analog die and the digital die) of a mixed-signal IC device may remain electrically isolated from one another until the IC device is coupled to (or placed on) a display substrate (such as glass or plastic).

Figure 8A:
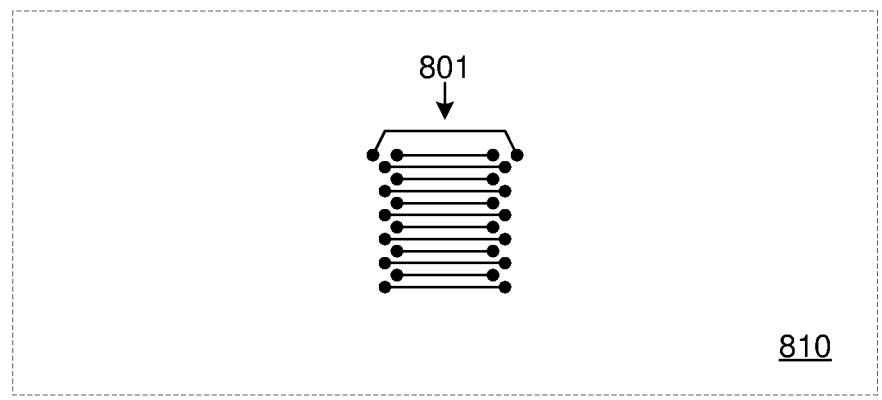
FIG. 8A shows an example chip-on-substrate (COS) assembly with connections for a multi-die IC device, in accordance with some embodiments.

FIG. 8A shows an example chip-on-substrate (COS) assembly 800A with connections for a multi-die IC device, in accordance with some embodiments. The COS assembly 800A includes a substrate 810 with a plurality of conductors 801 disposed thereon. The substrate 810 may comprise glass, plastic, or other material on which a multi-die IC device is to be placed. For example, the substrate 810 may correspond to a display surface for a display or touch-screen device. The conductors 801 may include conductive traces and/or wires disposed in a pre-configured arrangement. In some embodiments, the substrate 810 may be pre-wired to receive a multi-die IC device (e.g., a mixed-signal IC device). For example, the arrangement of the conductors 801 may be based on an arrangement or layout of circuitry on the multi-die IC device. More specifically, the conductors 801 may be pre-configured to couple one or more circuit components residing on a first die of the IC device to one or more circuit components residing on a second die of the IC device.

Figure 8B:
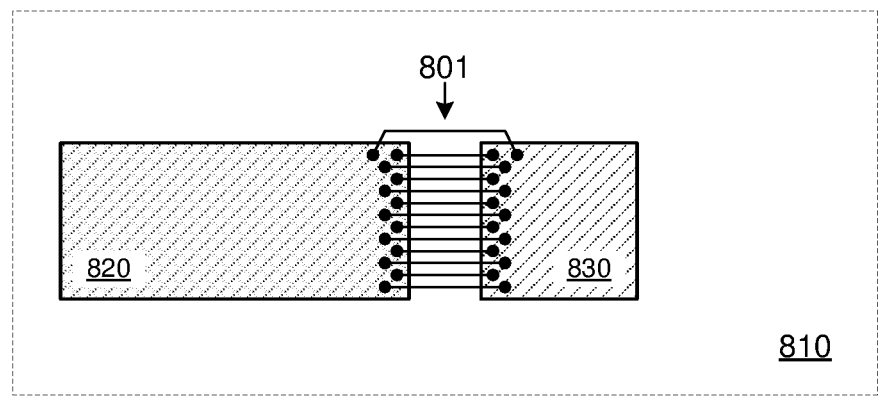
FIG. 8B shows an example COS assembly including a multi-die IC device, in accordance with some embodiments.

FIG. 8B shows an example COS assembly 800B including a multi-die IC device, in accordance with some embodiments. The COS assembly 800B includes a first IC die 820 and a second IC die 830 in addition to the substrate 810 with the plurality of conductors 801 disposed thereon. In some embodiments, the first IC die 820 and the second IC die 830 may correspond to a multi-die (or mixed-signal) IC device such as described in the present disclosure. For example, the first IC die 820 may be cut from an analog wafer (e.g., analog wafer 120B of FIG. 1) and may thus include the analog circuitry of the mixed-signal IC device. On the other hand, the second IC die 830 may be cut from a digital wafer (e.g., digital wafer 120A of FIG. 1) and may thus include the digital circuitry of the mixed-signal IC device. In some embodiments, the first IC die 820 is electrically coupled to the second IC die 830 via the conductors 801 disposed on the substrate 810.

In some other embodiments, the first IC die 820 may be electrically isolated form the second IC die 830 until the die 820 and 830 are coupled to, or placed on, the substrate 810. It is noted that the placement of the die 820 and 830 on the substrate 810 may be performed by a manufacturer of the display device (e.g., rather than a manufacturer of the mixed-signal IC device). Thus, leaving the first IC die 820 decoupled from the second IC die 830, until placed on the substrate 810, reduces the number of processes in the manufacture of the mixed-signal IC device, which may further reduce the cost to manufacture each of a plurality of mixed-signal IC devices.

Figure 9:
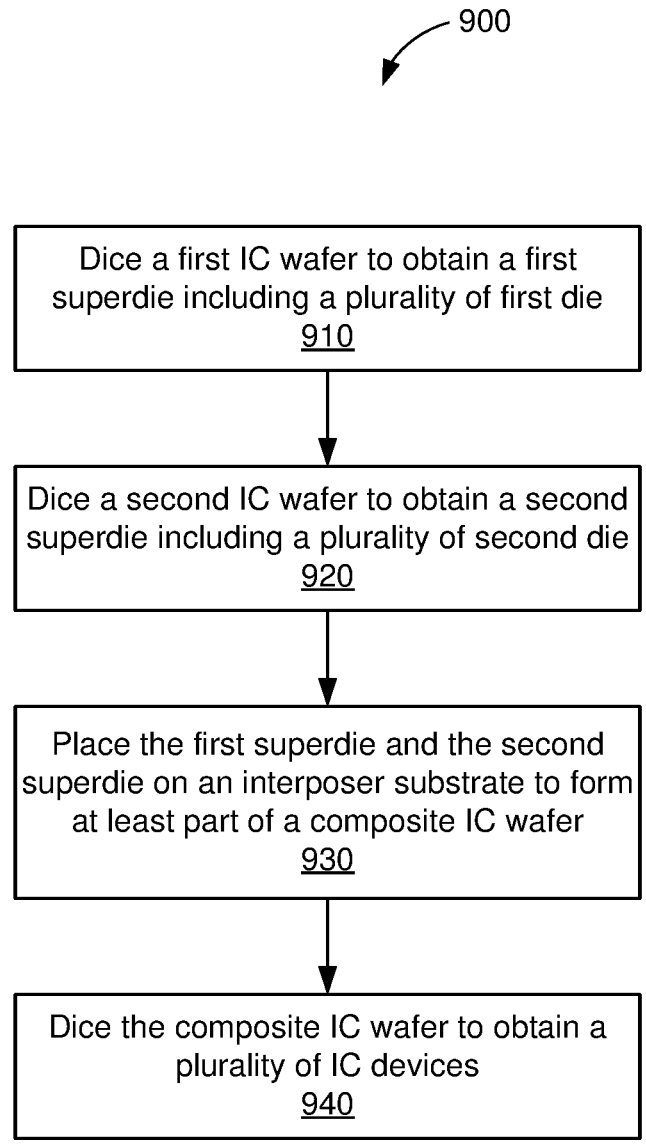
FIG. 9 is an illustrative flowchart depicting an example operation for manufacturing a mixed-signal IC device, in accordance with some embodiments.

FIG. 9 is an illustrative flowchart depicting an example operation 900 for manufacturing a mixed-signal IC device, in accordance with some embodiments. In some embodiments, the mixed-signal IC device may be a multi-die IC device formed from a combination of a first IC die (e.g., having analog circuitry disposed thereon) and a second IC die (e.g., having digital circuitry disposed thereon). With reference for example to FIG. 1, the example operation 900 may be used to manufacture or assemble the mixed signal IC device 140.

A first IC wafer is diced to obtain a first superdie including a plurality of first die (910). For example, the first IC wafer may correspond to a digital wafer (such as the digital wafer 120A) on which digital circuitry is fabricated. Thus, in some aspects, the first IC wafer may be fabricated using a process node that is optimized for manufacturing digital components. For example, a relatively small (e.g., 28, 40, or 55 nm), low-power (LP), or embedded-flash (EF) process may be used to fabricate the circuitry on the first IC wafer. The first IC wafer may be diced into one or more first superdie. In some embodiments, a first superdie may correspond to an undivided portion or segment of the first IC wafer. Thus, the first superdie may include a plurality of uncut (or unseparated) first die. Because each of the first die has yet to be diced or separated from the first superdie, each of the first die may be attached to at least one other first die of the first superdie (e.g., as described above with respect to FIG. 2).

A second IC wafer is diced to obtain a second superdie including a plurality of second die (920). For example, the second IC wafer may correspond to an analog wafer (such as the analog wafer 120B) on which analog circuitry is fabricated. Thus, in some aspects, the second IC wafer may be fabricated using a process node that is optimized for manufacturing analog components. For example, a relatively small (e.g., 28, 40, or 55 nm), low-power (LP), or embedded-flash (EF) process may be used to fabricate the circuitry on the second IC wafer. The second IC wafer may be diced into one or more second superdie. In some embodiments, a second superdie may correspond to an undivided portion or segment of the second IC wafer. Thus, the second superdie may include a plurality of uncut (or unseparated) second die. Because each of the second die has yet to be diced or separated from the second superdie, each of the second die may be attached to at least one other second die of the second superdie (e.g., as described above with respect to FIG. 2).

The first superdie and the second superdie are placed on an interposer substrate to form at least part of a composite IC wafer (930). More specifically, each of the first die may be aligned with a respective second die (in the composite IC wafer) in the configuration for which they will form a corresponding IC device. For example, the first superdie may be placed, on the interposer substrate, adjacent the second superdie such that the circuitry residing on the first superdie (e.g., each of the first die) can be electrically coupled to the circuitry residing on the second superdie (e.g., each of the second die). The interposer substrate provides structural support for the first superdie and the second superdie. However, in some embodiments, the interposer substrate may also provide at least some of the connections between the first die and the second die.

The composite IC wafer is diced to obtain a plurality of IC devices (940). For example, after aligning the first superdie with the second superdie on the interposer substrate, the composite IC wafer may be diced into individual IC devices (such as IC devices 140). Thus, each resulting IC device includes a respective first die (e.g., cut from the first superdie) and a respective second die (e.g., cut from the second superdie). In some embodiments, the resulting IC device may correspond to mixed-signal IC device. For example, the first die may include the digital circuit components for the mixed-signal IC device and the second die may include the analog circuit components for the mixed-signal IC device.

Figure 10:
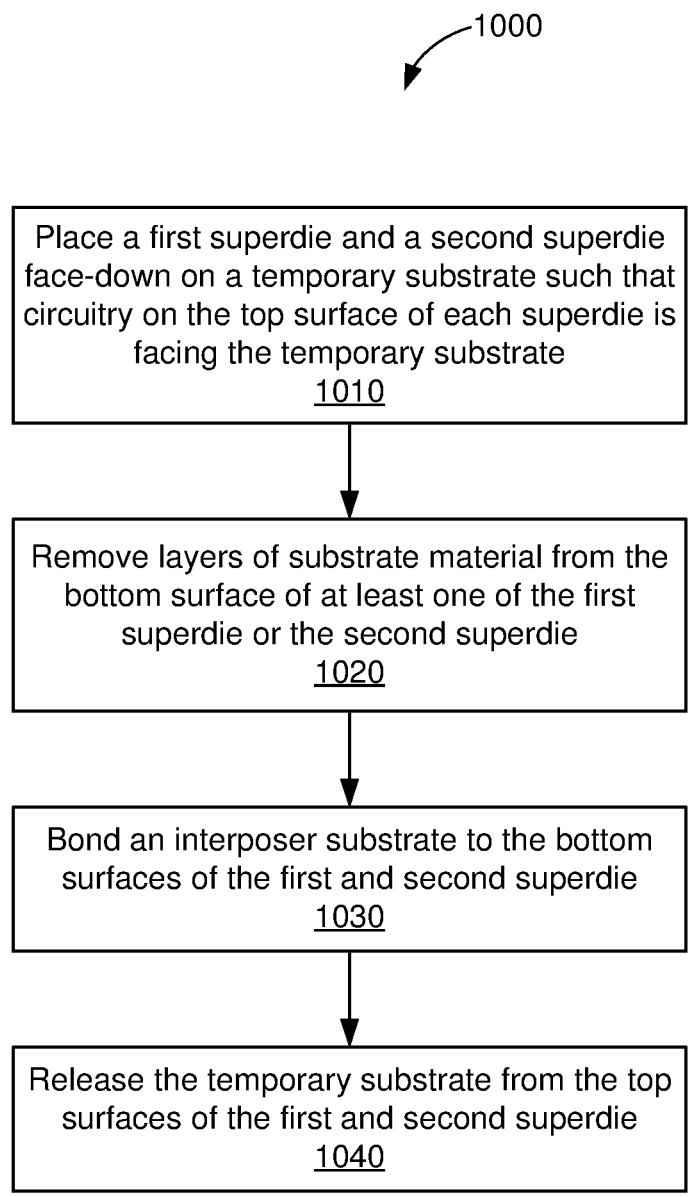
FIG. 10 is an illustrative flowchart depicting an example operation for creating a composite IC wafer, in accordance with some embodiments.

FIG. 10 is an illustrative flowchart depicting an example operation 1000 for creating a composite IC wafer, in accordance with some embodiments. In some embodiments, the composite IC wafer may be used to create a plurality of mixed-signal IC devices. With reference for example to FIGS. 7A-7D, the example operation 1000 may be used to bond a plurality of superdie to an interposer substrate while avoiding any handling of thin die.

A first superdie and a second superdie are placed face-down on a temporary substrate such that circuitry on the top surface of each superdie is facing the temporary substrate (1010). The temporary substrate may include any suitable material that provides a temporary surface on which the first and second superdie can be aligned. In some embodiments, the first and second superdie may be picked and placed on the temporary substrate in their original thick form (e.g., prior to thinning). As shown in FIG. 7A, each of the first and second superdie may be placed face-down on the temporary substrate (e.g., so that circuitry 702 and 704 on the top surfaces of the superdie 712 and 722, respectively, faces the temporary substrate 730). In some aspects, the first and second superdie may be attached or bonded to the temporary substrate using a removable adhesive (e.g., epoxy, hard wax, resin, or glue).

Layers of substrate material are removed from the bottom surface of at least one of the first superdie or the second superdie (1020). More specifically, as shown in FIG. 7B, the superdie may be thinned while remaining face-down on the temporary substrate. For example, the thinning may be performed using backgrinding, CMP, or other suitable wafer-thinning techniques. In some embodiments, each of the first and second superdie may be thinned to a threshold thickness. In some other embodiments, one or more of the superdie may be thinned until the bottom surfaces of the first and second superdie are substantially coplanar. Thus, the thinning operation may ensure that the bottom surfaces of the first and second superdie provide a substantially flat or level surface on which an interposer substrate can be bonded.

An interposer substrate is then bonded to the bottom surfaces for the first and second superdie (1030). As described above, the interposer substrate (e.g., which may be silicon, glass, or any other suitable material) provides structural support for the first and second superdie. More specifically, the interposer substrate may permanently hold the first and second superdie in alignment after the combined wafer is diced into a plurality of mixed-signal IC devices. As shown in FIG. 7C, the interposer wafer may be bonded to the bottom surfaces of the first and second superdie while the top surfaces of the superdie are still attached to the temporary substrate 730. It is noted that, because the first and second superdie are already aligned on the temporary substrate, the interposer wafer may be bonded to the superdie without handling thin die (e.g., as described above with respect to FIGS. 7A-7D).

The temporary substrate is subsequently released from the top surfaces of the first and second superdie (1040). For example, the temporary substrate may be released by heating or melting the adhesive holding the temporary substrate to the top surfaces of the first and second superdie. Upon releasing the temporary substrate, the resulting assembly may correspond to a composite IC wafer. It is noted that, because the first and second superdie were aligned face-down on the temporary substrate (e.g., as shown in FIGS. 7A-7C), the top surfaces of the first and second superdie may be substantially coplanar. Thus, in some embodiments, the circuitry of first superdie may be electrically coupled to the circuitry of the second superdie using existing wire bonding techniques. In some other embodiments, one or more conductors may be provided on the interposer substrate to couple the circuitry of the first superdie to the circuitry of the second superdie. Still further, in some embodiments, the circuitry of the first superdie may remain electrically isolated from the circuitry of the second superdie until after the composite IC wafer is diced into individual IC devices, and the IC devices are placed on a separate substrate (e.g., as described above with respect to FIGS. 8A and 8B).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method of manufacturing an integrated circuit (IC) device, comprising:
   dicing a first IC wafer to obtain a first superdie, the first superdie including a plurality of uncut first die, wherein the first IC wafer is an analog IC wafer comprising analog circuitry;
   dicing a second IC wafer to obtain a second superdie, the second superdie including a plurality of uncut second die, wherein the second IC wafer is a digital IC wafer comprising digital circuitry;
   placing the first superdie and the second superdie on an interposer substrate to form at least part of a composite IC wafer, wherein each of the first die is aligned with a respective one of the second die in the composite IC wafer; and
   dicing the composite IC wafer to obtain a plurality of IC devices, wherein each of the IC devices includes a respective one of the first die and the second die with which it is aligned.

2. The method of claim 1, wherein the first superdie is fabricated on the first IC wafer using a first process node, and wherein the second superdie is fabricated on the second IC wafer using a second process node that is different than the first process node.

3. The method of claim 2, wherein the first process node corresponds to a low-power (LP) or embedded-flash (EF) process, and wherein the second process node corresponds to a high-voltage (HV) process.

4. The method of claim 1, wherein the placing comprises:
   placing the first superdie next to the second superdie in a coplanar configuration.

5. The method of claim 1, wherein the placing comprises:
   placing the first superdie on at least a portion of the second superdie in a stacked configuration.

6. The method of claim 1, wherein the placing comprises:
   connecting the first superdie with the second superdie on the interposer substrate such that each of the first die is electrically coupled to the second die with which it is aligned.

7. The method of claim 1, further comprising:
   placing, on a first substrate, a first IC device of the plurality of IC devices obtained from the dicing of the composite IC wafer; and
   electrically coupling the first die to the second die, in the first IC device, via conductors residing on the first substrate.

8. The method of claim 7, wherein the first die is electrically isolated from the second die, in the first IC device, prior to the placement of the first IC device on the first substrate.

9. The method of claim 7, wherein the first substrate comprises a glass or plastic substrate.

10. The method of claim 1, wherein the placing comprises:
    placing the first superdie and the second superdie face-down on a temporary substrate such that circuitry disposed on a top surface of each of the first and second superdie is facing the temporary substrate;
    removing layers of semiconductor substrate from a bottom surface of at least one of the first superdie or the second superdie while the first and second superdie are placed on the temporary substrate;

when a threshold amount of the semiconductor substrate has been removed, bonding the interposer substrate to the bottom surfaces of the first and second superdie; and releasing the temporary substrate from the first and second superdie when the first and second superdie are bonded to the interposer substrate.

11. The method of claim 10, wherein the removing comprises:

removing layers of the semiconductor substrate until the bottom surface of the first superdie is coplanar with the bottom surface of the second superdie.

12. The method of claim 10, wherein the top surface of the first superdie is coplanar with the top surface of the second superdie when the first and second superdie are bonded to the interposer substrate.

13. A composite integrated circuit (IC) wafer, comprising:
an interposer substrate;
a first superdie including a plurality of uncut first die, wherein the first superdie is diced from a first IC wafer, wherein the first IC wafer is an analog IC wafer comprising analog circuitry, and wherein the first superdie is disposed on the interposer substrate; and
a second superdie including a plurality of uncut second die, wherein the second superdie is diced from a second IC wafer, wherein the second IC wafer is a digital IC wafer comprising digital circuitry, and wherein the second superdie is positioned relative to the first superdie such that each of the first die is aligned with a respective one of the second die.

14. The composite IC wafer of claim 13, wherein each of the first die is attached to another of the first die and each of the second die is attached to another of second die.

15. The composite IC wafer of claim 13, wherein the first superdie corresponds to an undivided portion of the first IC wafer and the second superdie corresponds to an undivided portion of the second IC wafer.

16. The composite IC wafer of claim 15, wherein the first superdie is fabricated on the first IC wafer using a first process node, and wherein the second superdie is fabricated on the second IC wafer using a second process node that is different than the first process node.

17. The composite IC wafer of claim 13, wherein the second superdie is coplanar to the first superdie on the interposer substrate.

18. The composite IC wafer of claim 13, wherein the positioning of the second superdie relative to the first superdie comprises stacking the second superdie on top of the first superdie.

19. The composite IC wafer of claim 13, wherein the first superdie is connected to the second superdie on the interposer substrate such that each of the first die is electrically coupled to the second die with which it is aligned.

20. A chip-on-substrate (COS) assembly, comprising:
a substrate;
one or more conductors provided on the substrate;
a first integrated circuit (IC) die including first circuitry, wherein the first IC die is diced from a first IC wafer, and wherein the first IC wafer is an analog IC wafer and the first circuitry comprises analog circuitry;
a second IC die including second circuitry, wherein the second IC die is diced from a second IC wafer, and wherein the second IC wafer is a digital IC wafer and the second circuitry comprises digital circuitry; and
an IC device including the first circuitry and the second circuitry, wherein the first circuitry is electrically coupled to the second circuitry via the one or more conductors.

* * * * *